(12) United States Patent
Kellar

(10) Patent No.: US 6,700,517 B1
(45) Date of Patent: Mar. 2, 2004

(54) PHOTONIC ANALOG-TO-DIGITAL CONVERTER

(75) Inventor: Kevin K. Kellar, Bloomfield, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 10/326,963

(22) Filed: Dec. 24, 2002

(51) Int. Cl.$^7$ ............................................... H03M 1/00
(52) U.S. Cl. .................. 341/137; 341/126; 341/131; 341/155; 359/123; 359/139; 359/158; 359/237
(58) Field of Search ........................ 341/126, 137, 341/155, 131; 356/237, 123, 158, 139

(56) References Cited

U.S. PATENT DOCUMENTS

| | | | | |
|---|---|---|---|---|
| 4,441,096 A | * | 4/1984 | Evanchuk | 341/137 |
| 4,694,276 A | * | 9/1987 | Rastegar | 341/137 |
| 4,928,007 A | * | 5/1990 | Furstenau et al. | 341/137 |
| 4,991,920 A | * | 2/1991 | Peczalski | 385/14 |
| 6,064,325 A | * | 5/2000 | Fields et al. | 341/137 |
| 6,118,396 A | * | 9/2000 | Song | 341/137 |
| 6,175,320 B1 | * | 1/2001 | Heflinger | 341/137 |
| 6,188,342 B1 | | 2/2001 | Gallo | 341/137 |
| 6,265,999 B1 | | 7/2001 | Pruncnal | 341/137 |
| 6,326,910 B1 | | 12/2001 | Hayduk et al. | 341/137 |
| 6,404,365 B1 | | 6/2002 | Heflinger | 341/137 |
| 6,404,366 B1 | | 6/2002 | Clark et al. | 341/137 |
| 6,420,985 B1 | | 7/2002 | Toughlian et al. | 341/137 |

* cited by examiner

Primary Examiner—Michael Tokar
Assistant Examiner—Linh Van Nguyen
(74) Attorney, Agent, or Firm—Mark Homer

(57) ABSTRACT

A method of photonic analog-to-digital conversion including the steps of using an analog signal to modulate a laser, splitting the modulated optical output into $2^N$ paths, attenuating the different paths along a gradient, then splitting each path again and recombining with an adjacent path in such a way that only one path has significant energy. An implementation architecture is also provided which includes a laser source, a modulator for modulating the laser source in accordance with an analog input signal, a first splitter section for splitting the modulated optical output into $2^N$ paths, and for attenuating the different paths along a gradient, an interferometer section for splitting each path again and for recombining the signals in such a way that only one path has significant energy, and a decoder section for outputting a digital word corresponding to the analog input signal.

13 Claims, 4 Drawing Sheets

PHOTONIC ANALOG-TO-DIGITAL CONVERTER

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

1. Field of the Invention

The present invention relates to analog-to-digital converters (ADC) and, more particularly, to an architecture for faster optical analog-to-digital conversion with larger bandwidth and a technique for incorporating the architecture in electronic devices.

2. Description of the Background

Electronic conversion of analog signals to digital format is a well-established technology, but the constant, strong consumer demand for faster speeds has created a demand for faster optical analog to digital (A/D) converters to provide higher sampling rates and allow conversion of ever-higher frequency analog signals.

A variety of optical (or "photonic") A/D converters have evolved more recently to satisfy the need, and existing photonic A/D converters have taken a variety of forms.

One known approach to high-speed analog-to-digital conversion uses an electrooptical modulator for optical sampling. See H. F. Taylor, "An Electrooptic Analog-to-Digital Converter, Proceedings of the IEEE, Volume 63, Pages 1524–1525, 1975. Taylor's electrooptic A/D converter uses an electrooptic modulator with an output intensity that has a periodic dependence on the voltage applied to its modulation input. The output of the modulator is captured by a photodetector and compared to a threshold signal. The result of the comparison is a digital output that represents an analog-to-digital conversion of the analog voltage applied to the modulation input. Taylor also discloses a multibit A/D converter that uses multiple modulators where the ratio of the output intensity to the input voltage of each modulator is progressively scaled by a factor of two. However, the speed of Taylor's electrooptic A/D converter is limited by the speed of the electronic amplifiers and comparators that compare the modulator outputs to the threshold signal.

Subsequent efforts have attempted to increase the speed by replacing the electronic circuitry with optical circuitry. For example, U.S. Pat. No. 6,420,985 to Toughlian et al. issued Jul. 16, 2002 shows a photonic wide-band analog to digital converter in which an analog electrical signal is first converted to an optical signal having a wavelength that is a function of the amplitude of the analog electrical signal. The optical signal is then filtered in a plurality of optical filter channels to create N optical bit signals forming an N bit binary word indicating the wavelength of said optical signal. These optical bit signals are then each converted to an electrical bit signal to form an electrical binary word. Toughlian et al. '985 eliminates all electronics by using a tunable laser to convert the electrical signal to an optical signal having a wavelength that is a function of the amplitude of the analog electrical signal. As with Toughlian '985, other known devices tend to split or divide the stream of pulses into a number of streams proportional to the resolution sought, and then they attenuate the paths by a different amount. See, for example, U.S. Pat. No. 6,326,910 issued to Hayduk et al. on Dec. 4, 2001.

U.S. Pat. No. 6,404,366 to Clark et al. issued Jun. 11, 2002, shows a photonic analog-to-digital converter that uses wavelength division multiplexing and distributed optical phase modulation. The analog-to-digital conversion is performed within the optical system of the ADC and thus facilitates ADC conversion at much higher speeds than available with conventional electronic ADCs. First, a plurality of optical signals of differing wavelengths is produced using a multiwave length optical source. These multiwave length signals are passed through a polarizer in order to set an initial polarization state in the ADC system. The polarized optical signals are passed through an electrooptic modulator that modifies the polarization states of the optical signals. This way, the change in polarization is converted to a change in optical intensity, which can be used to produce an individual binary optical output representing a most significant bit in the digitized representation of the analog signal. The modified optical signal is then passed through a wavelength filter, disposed in between a plurality of electrooptic modulators, in order to extract an optical signal of a specified wavelength. The unextracted optical signals are passed through a second electrooptic modulator to produce a modified optical signal, and the modified optical signal is passed through a second wavelength filter to extract an optical signal of another specified wavelength. The extracted signal is likewise processed to produce an individual binary optical output. The above method continues until signals of all the wavelengths are extracted and processed resulting in binary optical outputs. The combination of all the binary optical outputs produces a digital equivalent value of the analog signal.

U.S. Pat. No. 6,188,342 issued to Gallo on Feb. 13, 2001 shows a photonic A/D converter using parallel synchronous quantization of optical signals. The converter divides the input optical signal into N channels such that each channel is provided progressively more optical power from most to least significant bit on a predetermined scale. This is accomplished by giving each channel a different number of photodetectors, such that the most significant channels have the least number of photodetectors. The channel with the least sensitivity (that is, the fewest number of photodetectors) determines the most significant bit in the quantization of the lightwave signal. This allows a division of the input analog optical signal whereby a small fraction of the signal is used to determine the most significant bit and greater portions of the input signal are directed to each lesser significant bit.

U.S. Pat. No. 6,404,365 issued to Heflinger on Jun. 11, 2002 shows a fully optical analog to digital converter with complementary outputs. The Heflinger '365 patent uses a Mach-Zehnder interferometer, which splits the light from each path into two split out interferometer paths and then combines the two paths to generate two complimentary output signals. When the two paths are combined, optical interference directs the light proportionally into the two complimentary output signals. In operation, the output of each interferometer is a complementary sinusoidal variation in the intensity partitioned between the two output signals. Thus, the interferometer for the most significant bit delivers just one cycle of variation in intensity. The interferometer for the next most significant bit experiences two complete cycles, etc.

Although Heflinger '365 generally suggests splitting and recombining the paths to vary the bit significance, the interferometer approach is relatively expensive and space consuming. There remains a need for a high resolution, low power approach that is capable of implementation in a small package, e.g., that can fit on an integrated circuit.

SUMMARY OF THE INVENTION

It is, therefore, a desired feature of an A/D converter architecture of the present invention that each path be attenuated by a different amount (attenuates the different paths along a gradient), then splits each path again and recombines each one with an adjacent path in such a way that only one path has significant energy.

According to the present invention, the above described and other features are accomplished by a method of photonic analog-to-digital conversion including the steps of using an analog signal to modulate a laser, splitting the modulated optical output into N paths, attenuating the different paths along a gradient, then splitting each path again and recombining with an adjacent path in such a way that only one path has significant energy. Implementation architecture is also provided and this is comprised of a laser source that is modulated into $2^N$ paths (where N is the number of bits of resolution). Each of the paths is attenuated by a different amount, and then each path is split again and recombined with an adjacent path. The lines are recombined in such a way that only one path has significant energy. This signal is fed to a decoder that directs the light to the proper photodiodes, where it is converted to a binary word.

The present invention's method and implementation architecture is simple and, straightforward, and can be economically manufactured using standard integrated circuit fabrication technology.

BRIEF DESCRIPTION OF THE DRAWINGS

Other objects, features, and advantages of the present invention will become more apparent from the following detailed descriptions of the preferred embodiments and certain modifications thereof when taken together with the accompanying drawings in which.

DETAILED DESCRIPTION OF THE PREFERRED EMBODIMENTS

Figure 1:
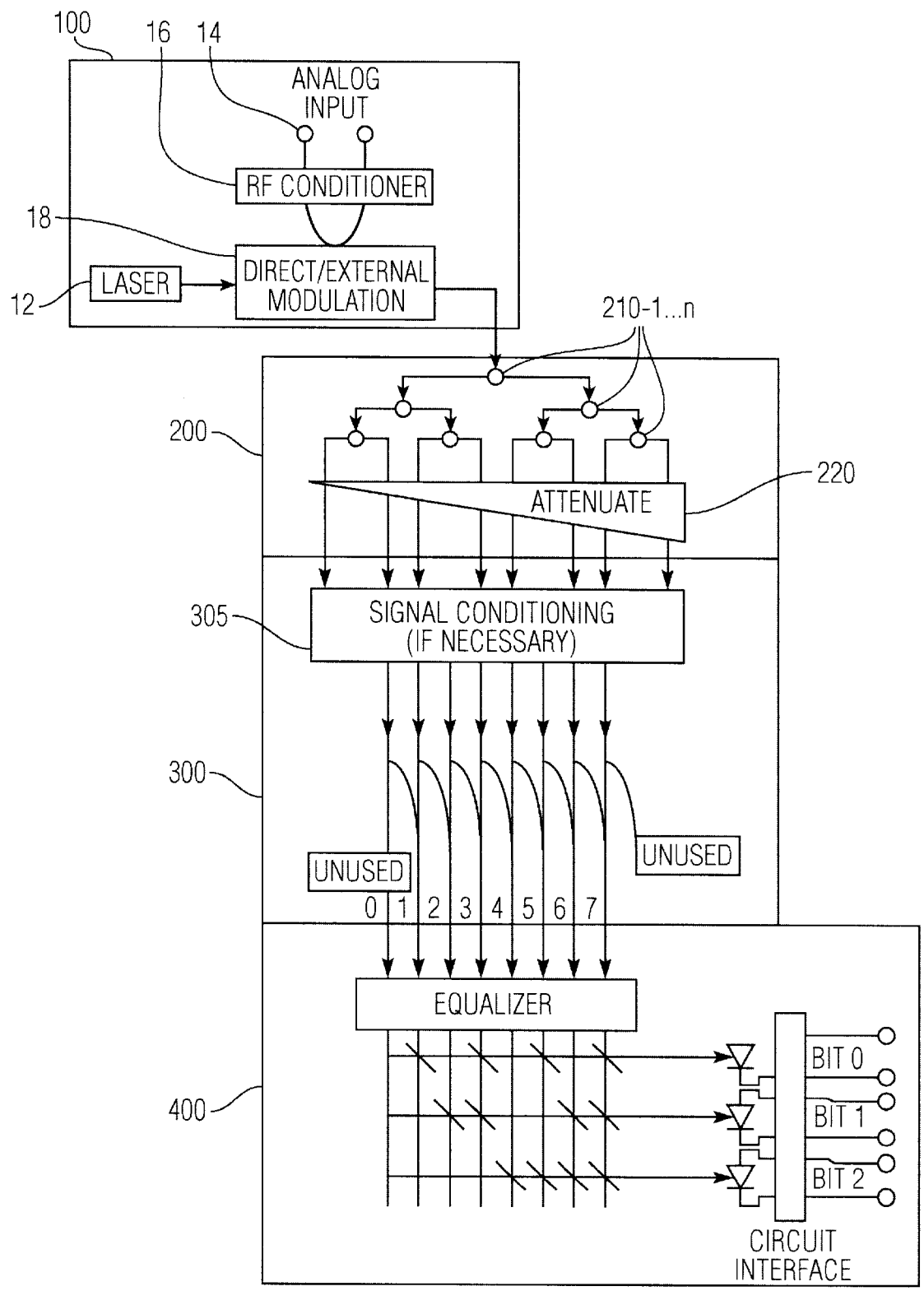
FIG. 1 is a block diagram of a photonic analog-to-digital (A/D), converter according to a preferred embodiment of the present invention.

FIG. 1 is a block diagram of a photonic analog-to-digital (A/D) converter according to a preferred embodiment of the present invention. The A/D converter generally comprises a Laser/Modulator Section (100) inclusive of a laser source and a modulator for modulating the laser source in accordance with an analog input signal, and a Splitter Section (200) for splitting the modulated optical output into N paths and for attenuating the different paths along a gradient. In addition, an Interferometer Section (300) divides each signal and recombines the signal with adjacent signals in such a way that only one path has significant energy. Finally, a Decoder Section (400) directs the waveguide with energy to a combination of photodiodes that corresponds to the waveguide, the photodiode's output being the digital value of the analog signal.

In operation, an analog input (14) interfaces to the analog signal that is to be digitized. The Laser/Modulator Section (100) produces a stable coherent wavelength and then modulates the laser in accordance with the analog input signal on the analog input (14) to provide amplitude modulated (AM) coherent wave output. The Splitter Section (200) divides the laser source into $2^N$ paths (where N is the number of bits of resolution). Each of the paths is attenuated by a different amount. Then, in the Interferometer Section (300) each path is split again, and is recombined with an adjacent path. The lines are recombined in such, a way that only one path has significant energy. This signal is fed to the Decoder Section (400) that directs the light to the proper photodiodes, where it is converted to a binary word.

Each of the foregoing sections is described in more detail below.

Laser/Modulator Section (100)

Laser/Modulator Section (100) includes a laser source (12) for producing a stable coherent light. An analog input (14) interfaces to the analog signal that is to be digitized. The analog signal to be digitized may be conditioned at RF conditioner (16). This conditioning may be different for different applications, i.e. for a low noise radar application the signal would require impedance matching and amplification through a low noise amplifier. (LNA), for a less demanding application where signal levels are higher and the operating environment is noisy, a conditioning network which provides RFI filtering and spike suppression would be appropriate. The conditioned analog signal is then presented to a modulator (18). Depending upon the application of the device either external or direct modulation is suitable.

For direct modulation, the light output of the laser source (12) is directly modulated, i.e., made to vary in response to current flow through the modulator (18) or with changes to the laser cavity to produce amplitude modulation (AM). Other parameters, such as the dielectric constant or the absorptivity of the laser cavity material may also be varied to produce AM output. The basic principles of these modulation techniques were developed during the late 1960's and 1970's and are further described in Hunsperger, R., Integrated Optics Theory and Technology, Fourth Edition, Springer-Verlag Berlin Heidelberg New York (1995). See, for instance, chapters 8 and 9 of Hunsperger for techniques for modulating the light of a semiconductor laser by using external electro-optic or acousto-optic modulators. See chapter 14 for a description of direct modulation of a semiconductor laser either by controlling the current flow through the device or by controlling some other internal cavity parameter. Such direct modulation of the laser output has the advantages of simplicity and high frequency operation.

The preferred implementation of the photonic analog-to-digital (A/D) converter is to integrate a laser and external modulator as a unitary photonic integrated circuit. For example, an electroabsorption modulated laser (EAM) is well-suited in the present context for its high-speed, low drive voltage, and high extinction ratio applications. "High-Speed Traveling-Wave Electroabsorption Modulators," Yi-Jen Chiu, Sheng Z. Zhang, Volkan Kaman, Joachim Piprek, and John E. Bowers, 46th SPIE Annual Meeting, San Diego, August 2001. Bandwidths above 30 GHz are obtainable. However, one skilled in the art will appreciate that the device may be constructed of discreet components, in which case discrete modulators 12 such as Photronic Devices® LDM1000 will suffice. The LDM1000 is a 100 kHz to 10 MHz Laser Diode Modulator capable of modulating a laser with a sine, square or pulse current wave. Bias current amplitude, modulation current amplitude and frequency are completely programmable and selectable using a simple menu structure (the LDM1000 laser diode modulator has a simple serial computer interface). The LDM1000 amplitude modulates (AM) the laser in accordance with the analog input signal to provide an AM modulated coherent wave output.

The output from the Laser/Modulator Section (100) is fed directly to a Splitter Section (200).

Splitter Section (200)

The Splitter Section (200) receives its input from the output of the Laser/Modulator Section (100). The signal is fed directly into a Splitter Section (210), which divides the incoming signal equally into $2^N$ branches (where N is the number of bits of resolution desired). Each path is then attenuated by a specific-amount at attenuator (220). The amount of attenuation is dependent on the required resolution.

Figure 2:
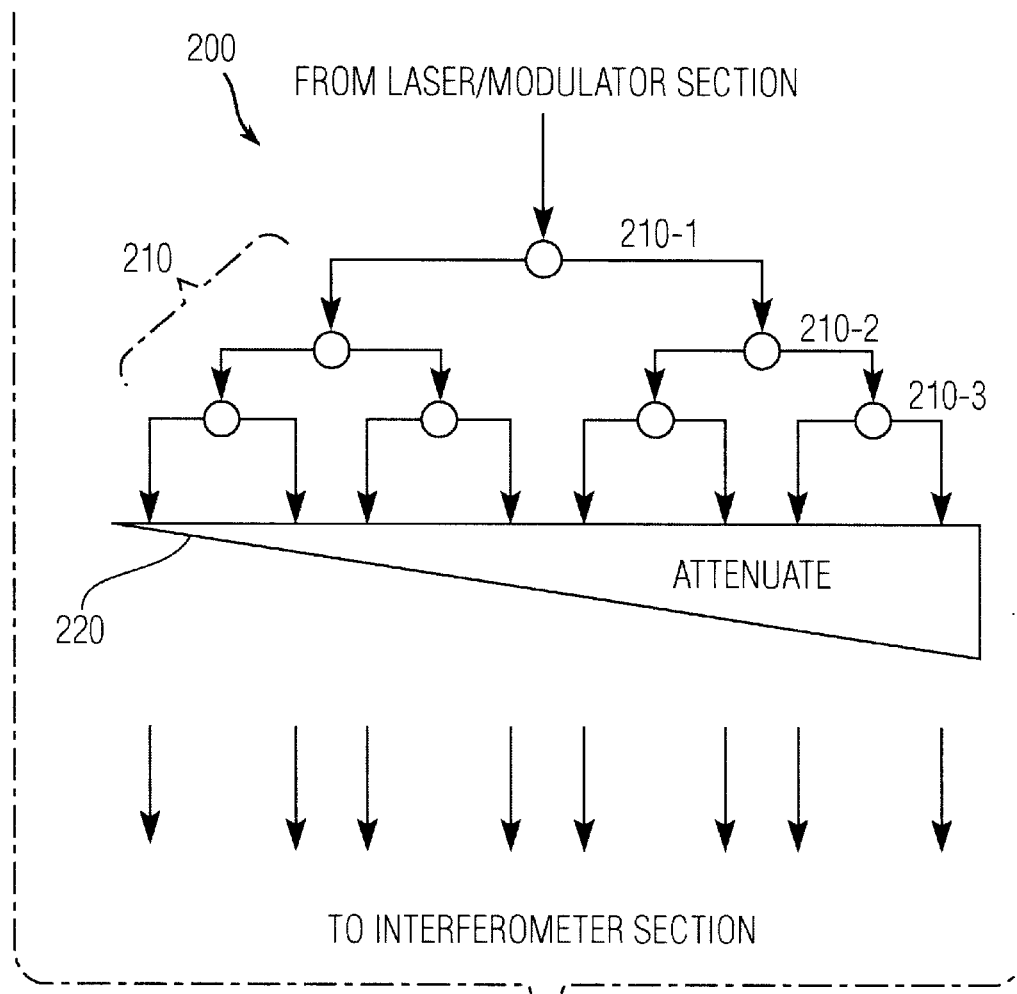
FIG. 2 is a graph illustrating an example of a $2^3$ (8) divider used in the photonic analog-to-digital (A/D) converter of the present invention.

Thus, for example, FIG. 2 left shows the splitting of the signal by 3 dB couplers (210–1 . . . 3), albeit 1×n couplers may be substituted. It should be apparent that larger networks would be required as the number of bits of resolution is increased.

Each of the $2^N$ branches is then fed to optical attenuator (220), which is designed to attenuate each branch by a different amount. In the preferred embodiment (photonic integrated circuit), the amount of attenuation for each branch falls along a gradient (as indicated) and is controlled by path length and dopant levels in the waveguide. However, the device can alternately be constructed using discrete components in which case a variety of commercially available optical attenuators are available for this purpose including the Koncent Technologies® optical attenuators which are wavelength independent, ultra low polarization sensitivity, and high directivity attenuators.

Interferometer Section (300)

The Interferometer Section (300) receives its input from the Splitter Section (200). The signal is conditioned at conditioner (305), if necessary, and is then split again, thereby creating $2 \times 2^N$ branches.

The signals are then recombined so that only one signal has significant energy.

Figure 3:
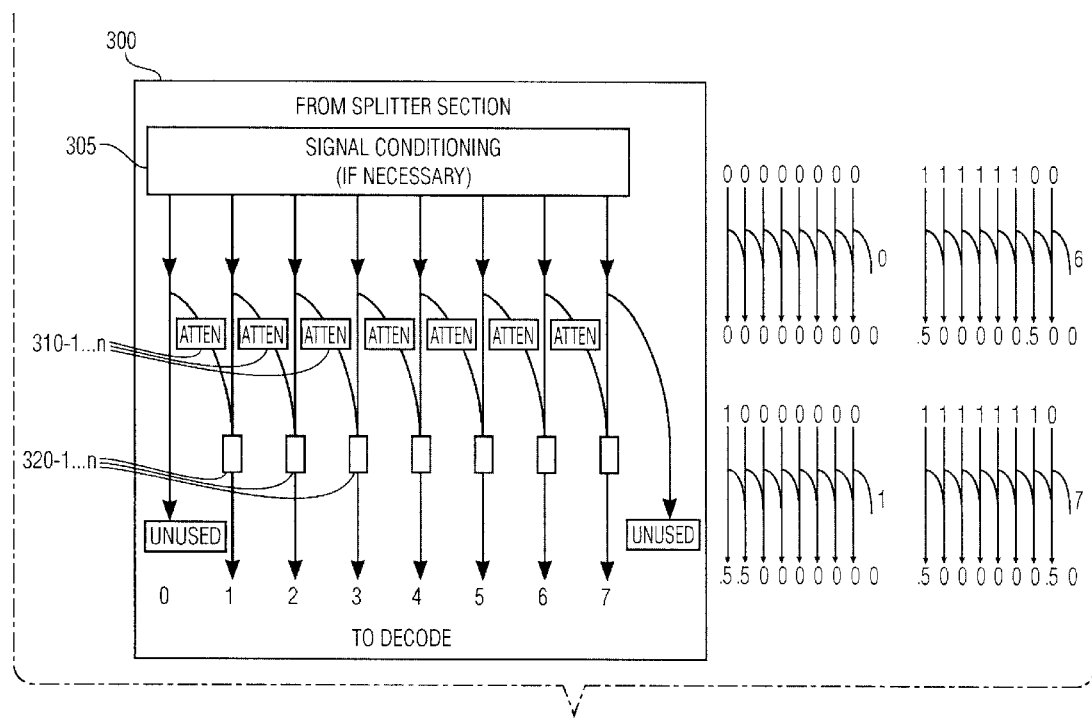
FIG. 3 is a more detailed diagram of the Interferometer Section (300) used in the present invention.

FIG. 3 is a more detailed diagram of the Interferometer Section (300), which may include a conditioning circuit (305). The conditioning circuit (305) is not preferred but may be necessary to bring the unamplified signals either to a high energy level or close to the no energy level. When the conditioning circuit (305) is necessary then its purpose is to saturate the incoming signals from Splitter Section (200) when they are above a specific level. This is accomplished by applying a nonlinear transfer function to saturate signals above a specified energy level. The conditioning network (305) also attenuates the other signals to very low levels. The implementing hardware for this may be, for example, semiconductor optical amplifiers (SOA) or multiple quantum wells (MQW). Again, the signals are attenuated as necessary to bring the unamplified signals close to the no energy level.

Next, each of the paths is attenuated by a different amount, and a series of attenuators (310–1) . . . n are provided for this purpose. Then each path is split again and is recombined with an adjacent path by a series of combiners (320–1 . . . n). The lines are recombined in such a way that only one path has significant energy. When the foregoing conditions are met, the diagrams at the right of FIG. 3 illustrate the transfer function (energy flow) for different energy combinations. The 1's and 0's at the right of FIG. 3 represent arbitrary high and low values. The 0.5 value indicates a level one half of the 1 level. 0's will always be to the right of the 1's. This is a necessary condition for proper operation. Generally, as the energy enters the waveguide, it is again divided with half of the energy continuing in the waveguide and the other half of energy entering the adjacent waveguide. Before entering the adjacent waveguide, the energy encounters a pi phase reversal (180 degree shift). The result is that the energy will be cancelled in the leg. Note that the energy will always increase when going from left to right. The result is that the energy destructively recombines. Not considering the first and last waveguides which are unused, the only waveguide which will have a significant amount of energy in it will be the waveguide with 0 entering it and a 1 adjacent which provides a 0.5 energy. The graphs at the right of FIG. 3 illustrate typical energy levels for a binary count of 0, 1, 6, and 7, respectively.

While the present device is preferably implemented as a photonic integrated circuit, one skilled in the art will understand that the above-described combining transfer function can also be accomplished using discrete components such as, for instance, by splicing optical fiber or using fiber couplers.

The ultimate output from the Interferometer Section (300) is a single waveguide with significant energy. The outputs of the Interferometer Section (300) are now presented to the Decoder Section (400).

Decoder Section (400)

Figure 4:
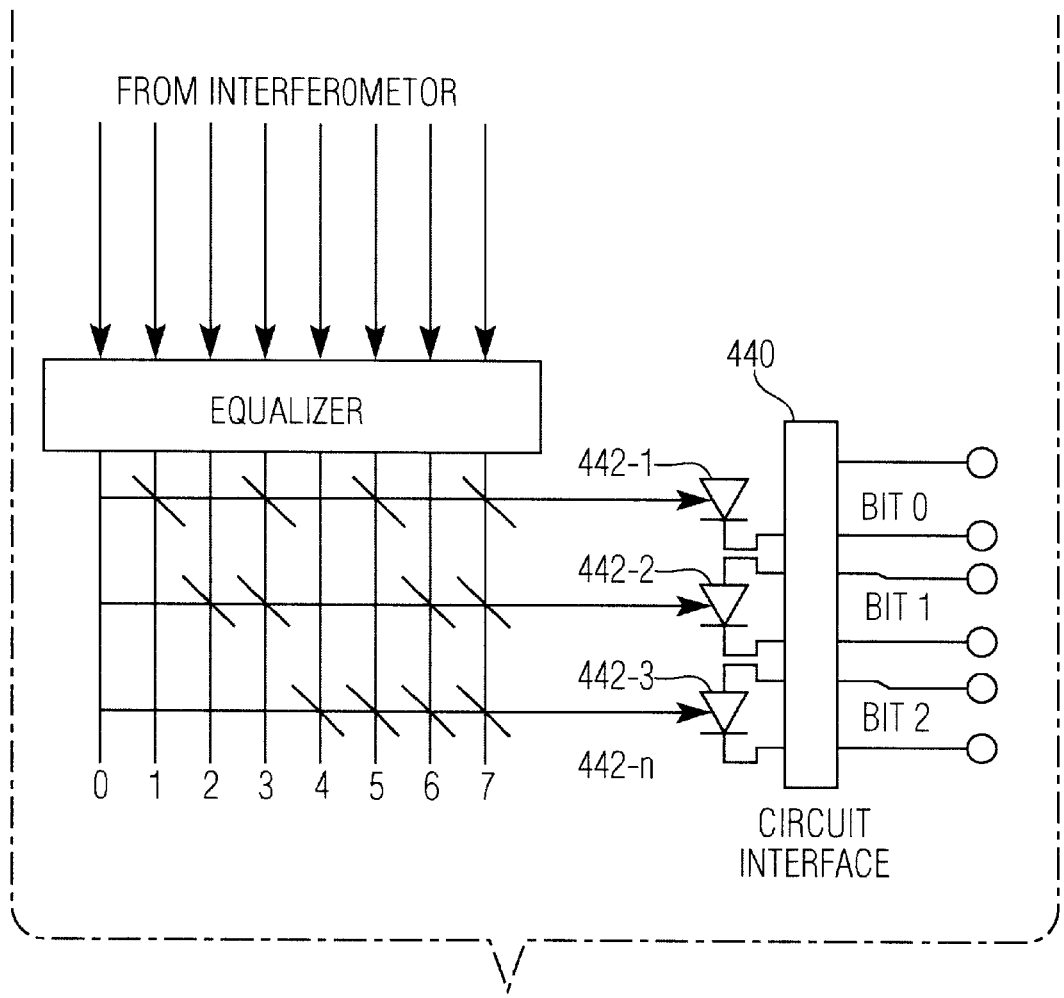
FIG. 4 is a more detailed diagram of the Decoder Section (460) used in the present invention.

The Decoder Section (400) receives its input from the Interferometer Section (300). Only one of the input waveguides will have significant energy. FIG. 4 is a more detailed diagram of the Decoder Section (400), which functions to direct the waveguide with energy to the photodiode arrays, which correspond to the waveguide. In other words, the singular optical path that has significant energy drives a particular combination of photodiodes that indicates the digital value of the original analog signal. The Decoder Section (400) may require an equalizer (410), which adjusts the signals intensity so that the energy, which reaches the photodiodes, is approximately the same after reflections from the "mirrors". In the preferred embodiment as a photonic integrated circuit, adjusting waveguide parameters will provide the necessary equalization if it is required. In a discrete configuration, this function could be provided by a Model 2200 dynamic gain equalizer from the Silicon Light Machines subsidiary of Cypress Semiconductor. The Equalizer (410) channels individually gain or lose optical power as necessary to maintain signal-strength flatness. The Silicon Light Machines unit lets you independently attenuate optical power across multiple wavelengths with equalization time of less than 1 msec. The output from the Equalizer (410) is fed through a decoder network (420), which directs the energy from the waveguide to the appropriate photodiodes (442–1 . . . n). There are a plethora of photodetector architectures that may be used depending upon the required conversion speed and responsivity. For example, PIN, Metal-Semiconductor-Metal (MSM), Multiple Quantum Well (MQW) Avalanche may all meet the requirements. Very high bandwidths are obtainable for example, MSM Traveling Wave Photodectors have bandwidths of 570 GHz. See, "Metal-Semiconductor-Metal Traveling-Wave Photodetectors", Jin-Wei Shi et al., IEEE Photonics Technology Letters, Vol. 16, No. 6, June 2001, page 623.

The output of the photodiodes may need to be conditioned for use by the host system. This conditioning is performed if necessary by the Circuit Interface (440).

The net result of the foregoing method and architecture is a faster optical analog-to-digital conversion approach and implementation architecture, which provides a high resolution, low power and small package, e.g., an integrated circuit photonic A/D converter.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims:

I claim:

1. A method for photonic analog-to-digital conversion including the steps of:

modulating a laser source with an analog signal to be digitized to produce a modulated optical output;

splitting the modulated optical output into $2^N$ paths, where N equals the number of bits of desired conversion resolution;

attenuating each of the $2^N$ paths by a different predetermined amount;

splitting each attenuated path again to produce $2 \times 2^N$ paths;

recombining each of the $2 \times 2^N$ paths with an adjacent path to yield only one path with significant energy;

decoding the recombined paths to/produce a binary word corresponding to the analog signal to be digitized;

outputting said binary word.

2. The method for photonic analog-to-digital conversion according to claim 1, wherein said step of modulating a laser source further comprises internally modulating said laser source to produce said modulated optical output.

3. The method for photonic analog-to-digital conversion according to claim 2, wherein said step of internally modulating a laser source further comprises conditioning said modulated optical output.

4. The method for photonic analog-to-digital conversion according to claim 1, wherein said step of modulating a laser source further comprises directly modulating said laser source to produce said modulated optical output.

5. The method for photonic analog-to-digital conversion according to claim 4, wherein said step of directly modulating a laser source further comprises conditioning said modulated optical output.

6. The method for photonic analog-to-digital conversion according to claim 1, wherein said step of attenuating each of the $2^N$ paths by a different predetermined amount further comprises attenuating each of the $2^N$ paths along a gradient.

7. The method for photonic analog-to-digital conversion according to claim 6, wherein said step of decoding the recombined paths to produce a binary word further comprises driving a plurality of photodiodes to indicate a digital value.

8. A device for photonic analog-to-digital conversion, comprising:

a laser source;

means for modulating the laser source in accordance with an analog input to be digitized to produce a modulated optical output;

a first splitter connected to said modulator for splitting the modulated optical output into $2^N$ paths, where N equals the number of bits of desired conversion resolution;

an attenuator connected to said first splitter for attenuating the $2^N$ paths along a gradient;

a second splitter connected to said attenuator for splitting each attenuated path again to produce $2 \times 2^N$ paths;

a combiner connected to the second splitter for recombining each of the $2 \times 2^N$ paths with an adjacent path to yield only one path with significant energy; and a decoder connected to the combiner for decoding the recombined paths to produce a binary word corresponding to the analog signal to be digitized.

9. The device for photonic analog-to-digital conversion according to claim 8, wherein said means for modulating the laser source further comprises an internal modulator.

10. The device for photonic analog-to-digital conversion according to claim 9, wherein said means for modulating the laser source further comprises a direct modulator.

11. The device for photonic analog-to-digital conversion according to claim 9, wherein said laser source, means for modulating the laser source, first splitter, attenuator, second splitter, combiner, and decoder are all formed as a unitary photonic integrated circuit.

12. The device for photonic analog-to-digital conversion according to claim 9, wherein said laser source, means for modulating the laser source, first splitter, attenuator, second splitter, combiner, and decoder are discrete components.

13. The device for photonic analog-to-digital conversion according to claim 9, wherein said decoder comprises a plurality of photodiodes for indicating a digital value.

* * * * *